United States Patent [19]

Amada

[11] Patent Number: 4,593,168
[45] Date of Patent: Jun. 3, 1986

[54] METHOD AND APPARATUS FOR THE HEAT-TREATMENT OF A PLATE-LIKE MEMBER

[75] Inventor: Haruo Amada, Kamisato, Japan

[73] Assignee: Hitachi, Ltd., Tokyo, Japan

[21] Appl. No.: 581,268

[22] Filed: Feb. 17, 1984

[30] Foreign Application Priority Data

Feb. 21, 1983 [JP] Japan .................................. 58-26178

[51] Int. Cl.⁴ .............................................. H05B 6/78
[52] U.S. Cl. ...................... 219/10.55 M; 219/10.55 F; 219/10.55 A; 219/10.67; 148/1.5; 427/45.1; 118/728; 118/50.1
[58] Field of Search .................. 219/10.55 F, 10.55 R, 219/10.55 M, 10.55 A, 10.49 R, 10.67; 427/45.1; 118/50.1, 728, 729, 730, 620; 148/1.5; 269/20, 21; 279/3.4

[56] References Cited

U.S. PATENT DOCUMENTS

| | | | |
|---|---|---|---|
| 3,521,018 | 7/1970 | Boerger et al. | 219/10.49 R |
| 3,699,298 | 10/1972 | Briody | 219/10.49 R |
| 4,138,306 | 2/1979 | Niwa | 219/10.55 R X |
| 4,254,319 | 3/1981 | Beh et al. | 219/10.55 F |
| 4,456,806 | 6/1984 | Arimatsu | 219/10.55 F X |

FOREIGN PATENT DOCUMENTS

52-14370  2/1977  Japan ............................. 219/10.55 R

Primary Examiner—Philip H. Leung
Attorney, Agent, or Firm—Antonelli, Terry & Wands

[57] ABSTRACT

The present invention relates to a method of heat-treating a semiconductor wafer by utilizing an electromagnetic wave. The wafer is floated by the blast of a gas and is held in a non-contacting state, and the electromagnetic wave, such as microwave, is projected on the wafer in this state so as to heat it. According to the present invention, only the wafer is heated and, hence, the wafer can be heat-treated uniformly and efficiently with great precision.

2 Claims, 9 Drawing Figures

METHOD AND APPARATUS FOR THE HEAT-TREATMENT OF A PLATE-LIKE MEMBER

BACKGROUND OF THE INVENTION

The present invention relates to a heat-treating technique, and more particularly to the heat treatment of a plate-like member such as a semiconductor wafer in the production of a semiconductor device.

As is well known, in case of producing semiconductor elements, the heat treatment of the semiconductor wafer is carried out in processes such as crystal growth, impurity diffusion, crystal annealing, passivation film forming, dry etching processing and photoresist baking.

Heretofore, heating systems employing a heater, high-frequency heating, etc., have been applied to these heat treatments. The heat-treating methods are such that the semiconductor wafer is supported by a jig or the like in a heating atmosphere and thus heated, or that the semiconductor wafer is directly put on a heating source such as a heating block and thus heat-treated. In any method, the wafer lies in contact with a supporter.

In order to precisely heat the wafer with the above methods, the supporting jig, heater block, or like support, must be precisely heated together with the wafer itself. Simultaneously, the surrounding inner wall of a processing chamber is heated. With the above methods, therefore, the heating efficiency is very inferior, and the processing time is long. Another disadvantage is that, when the jig or the heater block is large, the heat-treating apparatus becomes large in size.

Similarly, in the heat treatment accompanied with a reaction, that part other than the wafer which does not require the reaction, is heated. Therefore, the reaction takes place in the part other than the wafer requiring no reaction, and an unnecessary product is formed on the supporting jig of the object to be heat-treated or the inner wall of the processing chamber. As a result, in case of manufacturing a semiconductor element by the heat treatment accompanied with a reaction, the product falls on the wafer in which the semiconductor element is formed, to incur the degradation of the quality of the manufactured semiconductor element.

Also, incidental operations such as the operation of clearing away the unnecessary product formed on the inner wall of the processing chamber increase.

Also, in case of the foregoing heat-treatment, it is difficult to only heat the wafer.

SUMMARY OF THE INVENTION

An object of the present invention is to provide a heat-treating method which heat treats only a plate-like member, such as a wafer, uniformly and efficiently at high precision, and to provide an apparatus which is used for the method.

The object and novel features of the present invention will become apparant from the description of the specification and the accompanying drawings.

A typical aspect of the present invention will be briefly summarized below.

A plate-like member to be heat-treated, such as a silicon wafer, is floated by the blast of at least one gas so as to hold or maintain the member in a non-contacting state, i.e., free from contact with another element, and the member is irradiated with an electromagnetic wave such as microwave in this state in order to be heated. According to the present invention, only the member is heated, so that it is heat-treated uniformly and efficiently at high precision.

PREFERRED EMBODIMENTS OF THE INVENTION

Embodiment 1

Figure 1:
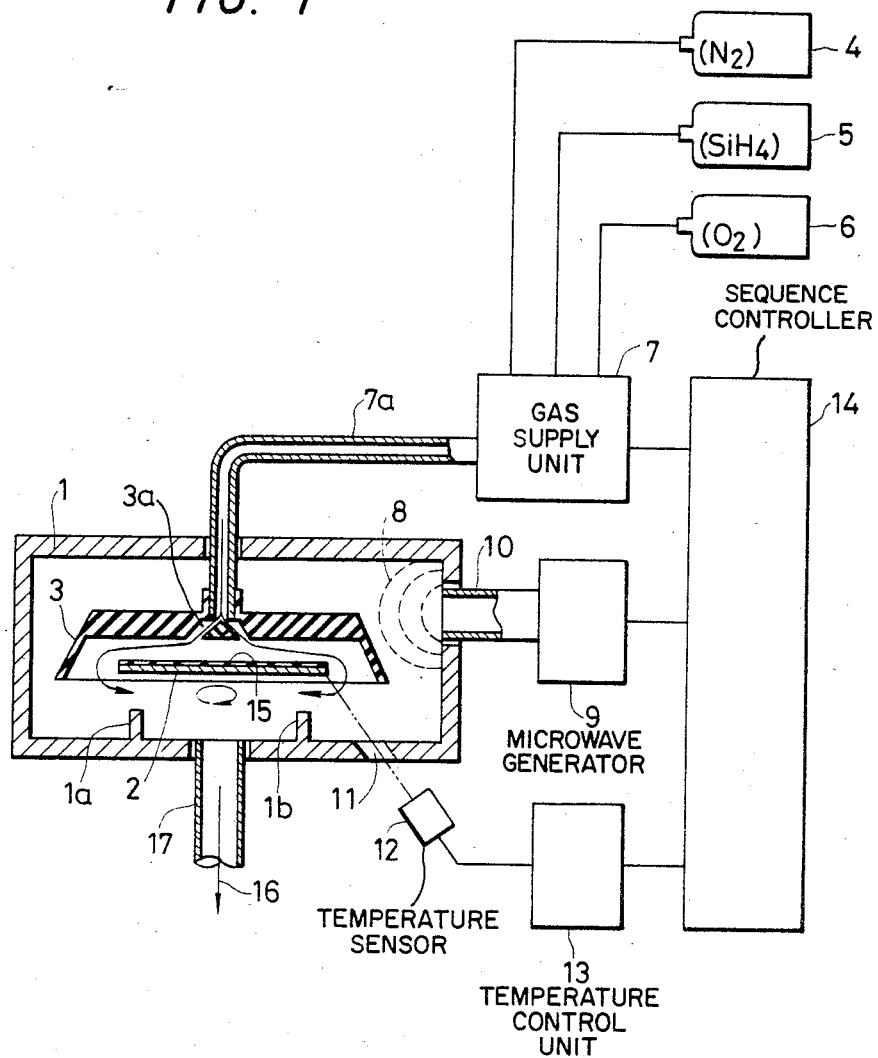
FIG. 1 is a partial sectional view of the essential portions of a heat-treating apparatus according to Embodiment 1 of the present invention.

FIG. 1 shows the essential elements of a heat-treating apparatus according to an embodiment of the present invention. This figure illustrates an example in which a protective film is formed on the front surface of a semiconductor wafer by the use of the heat-treating apparatus.

Referring to the figures, a processing chamber 1 is a box-like member which is made of a material adapted to reflect the microwave energy (electrically conductive or low resistivity material, for example, metal), and it defines a chamber for heating a semiconductor wafer 2 which is an object to be heat-treated. As the metal for the chamber, stainless steel or aluminum is selected, and it is especially favorable to employ aluminum of low resistivity. In the central part of the processing chamber 1, there is disposed a funnel-shaped, wafer-floating jig 3 (i.e., a holding mechanism or means) of the Bernoulli chuck structure which floats and holds the semiconductor wafer 2 in a non-contacting state. The wafer floating jig 3 is formed of a material which passes the microwaves and those electromagnetic loss is low, for example, a tetrafluoroethylene resin or quartz. The quartz permits even a treatment of high temperatures in excess of 1,000° C. In contrast, the tetrafluoroethylene resin degrades and is unusable in a case where it is exposed to a high temperature of above 350° C. by way of example. In addition, the wafer floating jig 3 is supplied with a clean inert gas 4 or reaction gases 5, 6 through a gas supply pipe 7a from a gas supply unit 7 which includes appropriate valves and conduits (not shown).

The microwaves 8 are generated by a microwave generator 9 (assigned frequency for induction heating: 2.45 GHz, maximum power: 500 W), and are projected into the processing chamber 1 through a waveguide 10. The semiconductor wafer 2 is irradiated with the microwaves and is inductively heated. The temperature of the heated semiconductor wafer 2 is measured by a temperature sensor 12 through a window 11, and the measured temperature is processed by a temperature control unit 13 and is transmitted to a sequence controller 14 as a temperature control signal.

The sequence controller 14 functions to select the gas (the inert gas 4 or the reaction gases 5, 6) and control the flow rate thereof, and to control the intensity of the microwaves 8 to be produced from the microwave generator 9, in accordance with the temperature control 13 to control the temperature of the semiconductor wafer 2 so that the temperature is kept constant.

On the other hand, the reaction gases 5 and 6 having formed a protective film 15 on the semiconductor wafer 2 are emitted out of the processing chamber 1 through a discharge portion 17 as a discharge gas 16.

Next, there will be described a method of forming the protective film 15 on the front surface of the semiconductor wafer 2 by the use of the apparatus, particularly a method of forming a CVD·SiO$_2$ film on the silicon wafer surface. The semiconductor wafer or silicon wafer (diameter: 4 inches, thickness: 240 μm) which is the object to be heat-treated is set on susceptors 1a and 1b in the processing chamber 1. The susceptors 1a, 1b have needle-like structures, and support the semiconductor wafer 2 at three points or four points. After the semiconductor wafer 2 has been set on the susceptors 1a, 1b, the inert gas 4 is first fed from the gas supply unit 7 in order to float the semiconductor wafer 2. N$_2$-gas is used as the inert gas 4. A valve of a conduit in unit 7 for the inert gas is opened by the sequence controller 14, and the inert gas passes through the gas supply pipe 7a and is emitted from the gas emission ports 3a of the wafer floating jig 3 toward the semiconductor wafer 2. This inert gas is emitted at 15 liters/min. The semiconductor wafer 2 floats while being moved vertically and rotated by the streams of the inert gas within the wafer floating jig 3. The principle on the basis of which the semiconductor wafer 2 floats within the wafer floating jig 3 is generally known as the "Bernoulli chuck." That is, when the inert gas 4 is fed to the wafer floating jig 3, a negative pressure phenomenon is caused between the semiconductor wafer 2 and the wafer floating jig 3 by the streams based on the blast of the inert gas 4, and the semiconductor wafer 2 floats within the wafer floating jig 3 in the non-contacting state while moving vertically and rotating. A distance between the wafer 2 and the jig 3 is determined by the flow rate of the inert gas 4. In this embodiment, the distance is about 1-2 mm.

With the semiconductor wafer 2 held in the floating state within the wafer floating jig 3, microwaves 8 are generated by the microwave generator 9 and are projected into the processing chamber 1 by the waveguide 10. The semiconductor wafer 2 is heated by the projected microwaves 8. Herein, only the semiconductor wafer 2 is heated because the parts other than the semiconductor wafer 2 is made of the material of low electromagnetic loss. The semiconductor wafer 2 is heated from the interior thereof by the electromagnetic losses, such as resistance loss and dielectric loss, of the semiconductor wafer 2 itself. Besides, it is heated without touching the wafer floating jig 3, etc. Therefore, it is heated efficiently and uniformly. The semiconductor wafer 2 has its temperature measured by the temperature sensor 12. While the intensity of the microwaves 8 is being controlled on the basis of the result of the temperature measurement of the semiconductor wafer 2 by the temperature sensor 12, the semiconductor wafer 2 is held at a predetermined temperature necessary for the reaction. In the case of forming the CVD (Chemical Vapor Deposition), ·SiO$_2$ film as in the present embodiment, the optimum temperature is 400° C. When the predetermined temperature required for the reaction has been reached, the reaction gases from sources 5 and 6 (SiH$_4$-gas and O$_2$-gas) necessary for the formation of the protective film (SiO$_2$ film) 15 are fed via the gas supply 7 into the wafer floating jig 3 in the state in which the inert gas is kept supplied.

The SiH$_4$-gas is diluted to 5% with N$_2$ in advance and the flow rate thereof is 1 liter/min. On the other hand, the flow rate of the O$_2$-gas is 0.5 liter/min. The SiH$_4$-gas and O$_2$-gas react on the front or upper surface of the semiconductor wafer 2 heated to the predetermined temperature, and the SiO$_2$ film 15 is formed on the front surface of the semiconductor wafer 2. The inner wall of the processing chamber 1 and the surface of the floating jig 3 are much lower in temperature than the surface of the semiconductor wafer 2, and are at temperatures at which the reaction with the reaction gas 5 does not take place. Therefore, any unnecessary reaction product (for example, SiO$_2$) is not formed on the walls of the chamber.

Embodiment 2

Figure 2:
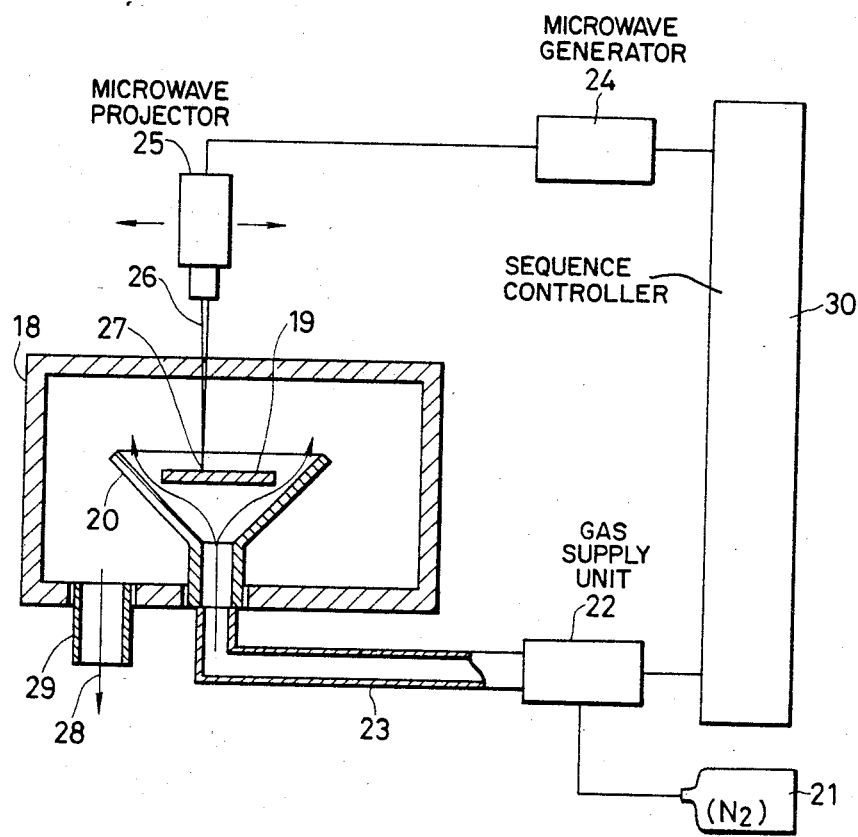
FIG. 2 is a sectional view of the essential elements of a heat-treating apparatus according to Embodiment 2 of the present invention.

FIG. 2 shows essential elements of an example in which the present invention is applied to an annealing apparatus. In a case where a semiconductor wafer (for example, silicon wafer) has been subjected to ion implantation, annealing needs to be performed in order to recover the crystal damages of the surface layer part of the semiconductor wafer due to the ion implantation.

This apparatus has a processing chamber 18 which is made of a material adapted to transmit the microwaves. A wafer floating jig 20 (holding mechanism) made of a material of low electromagnetic loss is funnel-shaped, and it causes a semiconductor wafer 19 to float and to be held with a gas, for example, inert gas such as N$_2$-gas 21 which is blown up from within the funnel. The inert gas 21 is cleaned, and it is fed from a gas supply unit 22 through a gas supply pipe 23 into the wafer floating jig 20. A microwave projector 23 brings the microwaves generated by a microwave generator 24, into a spot-shaped microwave beam 26, with which the semiconductor wafer 19 is partly irradiated to be locally heated. In addition, the microwave projector 25 has the structure for scanning the semiconductor wafer 19 in the radial direction thereof, and the crystal annealing of the whole area of the semiconductor wafer 19 is permitted by the movement of the local heating part or portion 27. The optimum temperature of the annealing is 900° C.–1,100° C. A sequence controller 30 effects the control of the intensity of the microwave beam 26 to be projected from the microwave projector 25, the control of the rate of feed of the inert gas from source 21 to be fed from the gas supply 22, etc. Further, an exhaust gas 28 is ejected from a discharge conduit 29. According to this embodiment, it is possible to heat only the desired portion of the semiconductor wafer.

Embodiment 3

Figure 3:
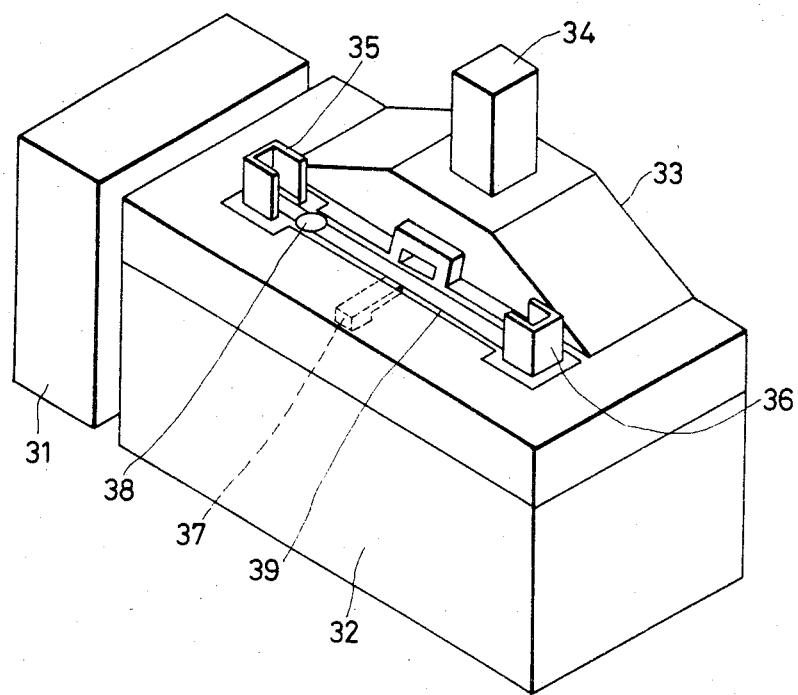
FIG. 3 is a perspective view of a microwave baking apparatus according to Embodiment 3 of the present invention.
Figure 4:
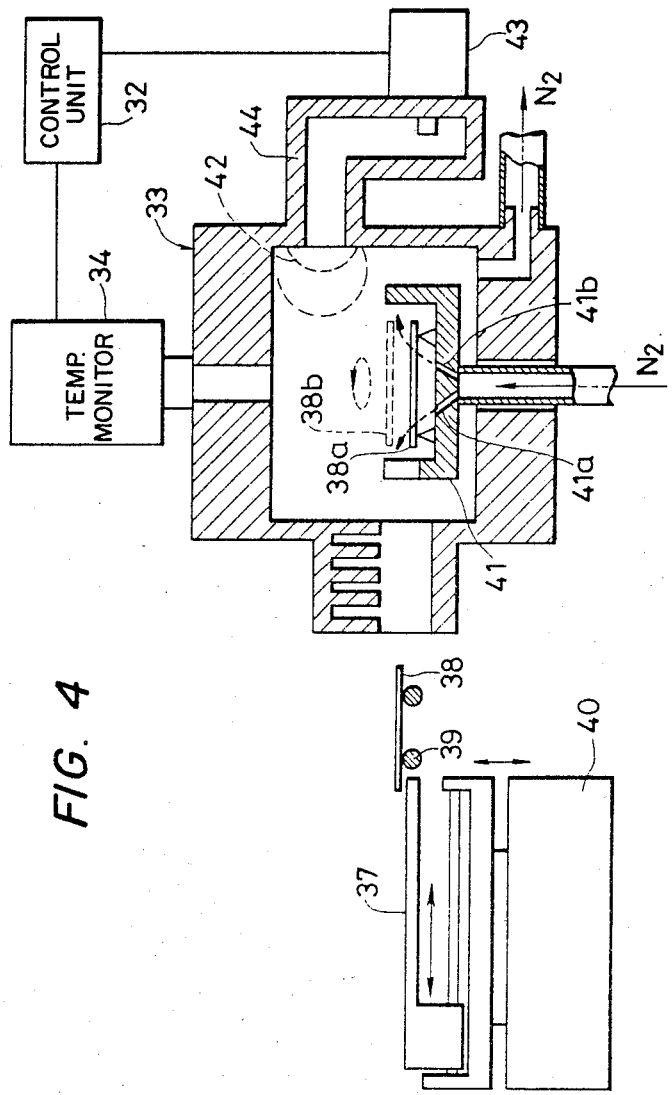
FIG. 4 is a sectional view of the essential elements of the microwave baking apparatus shown in FIG. 3.

FIG. 3 is a perspective view showing an example in which the present invention is applied to a heat-treating apparatus for baking a photoresist (hereinafter termed the "microwave baking apparatus"); while FIG. 4 is a partial sectional view of the essential elements of this microwave baking apparatus.

The microwave baking apparatus shown in FIG. 3 is constructed to include a power source 31, an output control 32 for bringing the microwave power to the optimum power, a heat-treating section 33, a temperature monitor 34, a loader 35, an unloader 36, and a handler 37 for transporting a semiconductor wafer 38 into the heat-treating portion 33. The semiconductor wafer 38 is transported from the loader 35 by a conveyor belt 39, and is stopped at the handler 37 by a stopper pin (not shown). This semiconductor wafer 38 is transported into the heat-treating section 33 by the handler 37. The heat-treated semiconductor wafer 38 is received in the unloader 36. The loader 35 and the unloader 36 can receive a plurality of semiconductor wafers, and move vertically.

Before describing the method of baking a photoresist with the microwave baking apparatus, the necessity of the baking treatment of the photoresist will be explained.

In manufacturing a semiconductor device, photolithography is indispensible. FIGS. 5A–5D are sectional views of steps illustrative of a process for selectively removing an $SiO_2$ film by photolithography.

Figure 5A:
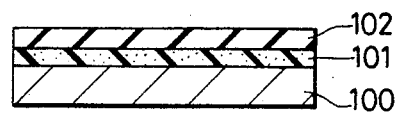
FIGS. 5A and 5D are sectional views of processing steps for explaining the photolithography of a semiconductor wafer.

First, as shown in FIG. 5A, an $SiO_2$ film 101 formed on the front surface of a Si wafer 100 is coated with a photoresist (negative type photoresist) film 102. Subsequently, the baking treatment of the photoresist called "prebaking (or soft baking)" is performed prior to the exposure of the photoresist employing a photo-mask. The prebaking thermally volatilizes a residual solvent component in the applied photoresist film (thickness: 8,500 Å) 102, thereby to enhance the efficiency of the photochemical reaction of a sensitive resin by ultraviolet energy irradiation in the exposure and to stabilize the sensitive resin. The prebaking requires a heating temperature of approximately 80° C., and is conducted in an $N_2$ atmosphere. The Si wafer 100 subjected to the prebaking has the predetermined photomask positioned thereto, and is irradiated with ultraviolet rays to be printed with a pattern. That is, the exposure processing is achieved.

Figure 5B:
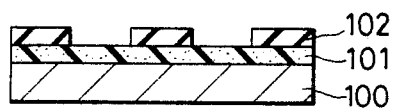

Next, developing is performed as shown in FIG. 5B. The photoresist film 102 having absorbed the ultraviolet energy to change its chemical structure has unnecessary parts dissolved by the developing and, thus, forms the pattern. Thereafter, the baking treatment of the photoresist called "post-baking (or hard baking)" is performed. The post-baking is a heat treatment which volatilizes an organic solvent having permeated in the photoresist film during the developing, thereby to enhance the resistances of the photoresist film against chemicals and to strengthen the adhesion of the photoresist film with the Si wafer. The post-baking is conducted at a heating temperature of approximately 150° C.

Figure 5C:
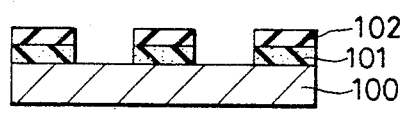

After the post-baking has ended, the Si wafer 100 bearing the photoresist the photoresist film 102 formed with the pattern is immersed in an etchant, and the final pattern desired is worked as shown in FIG. 5C. As the etchant of the $SiO_2$ film 101, an aqueous solution of $HF+NH_4F$ (volumetric ratio=1:6) is used.

Figure 5D:

When the unnecessary parts of the $SiO_2$ film 101 have been removed, the unnecessary photoresist film 102 is removed as shown in FIG. 5D.

As thus far described, the selective etching of the $SiO_2$ film is achieved by photolithography.

The prebaking and post-baking mentioned above are carried out by the microwave baking apparatus illustrated in FIG. 3 (FIG. 4). Hereinafter, the method of baking the photoresist film will be described with reference to FIG. 4.

Figure 6:
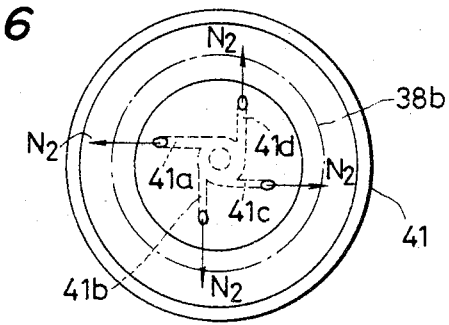
FIG. 6 is a plan view of a wafer floating jig according to the present invention.

The Si wafer 38 transported by the conveyor belt 39 is stopped on the handler 37 by a stopper pin (not shown). On a handler supported 40, the handler 37 moves vertically and horizontally as indicated by arrows. The fore end of this handler 37 is structurally adapted to draw the Si wafer 38 by vacuum suction. The stopped Si wafer 38 is drawn by vacuum (suction) and then transported into the heat-treating portion 33 by means of the handler 37 until it is placed on a wafer floating jig 41. The wafer floating jig 41 is provided with gas emission ports 41a and 41b. An inert gas such as $N_2$-gas is blown up from the gas emission ports 42a, 41b to float the Si wafer 38a into a state indicated by a dotted line. The floating Si wafer 38b is rotating owing to the inert gas. The rotation of the Si wafer 38b is realized by providing the gas emission ports 41a, 41b, 41c and 41d in four directions as shown in FIG. 6 and blowing out the inert gas $N_2$ through these emission ports.

With the Si wafer 38b held in the floating state within the wafer floating jig 41, the microwaves 42 are generated by a microwave generator portion 43 and projected from a waveguide 44 into the processing chamber 33. The Si wafer 38b is heated by the projected microwaves 42. Herein, only the Si wafer 38b is heated because the parts, other than the Si wafer 38, are made of the material of low electromagnetic loss. The Si wafer 38b is heated from the interior thereof by the electromagnetic losses, such as the resistance loss and the dielectric loss, of the Si wafer 38b itself, and it is heated without touching the wafer floating jig 41, etc., so that it is heated efficiently and uniformly. The heating temperature of the Si wafer 38b is measured by the temperature monitor 34, and the control unit 32 controls the output of the microwave generator 43 on the basis of the measured result. Consequently, the Si wafer 38b is held at the predetermined temperature necessary for the baking treatment of the photoresist film. In this way, the baking treatments (prebaking, post-baking) of the photoresist film are achieved. In particular, since the baking treatment of the photoresist film is intended to volatize the solvent in the photoresist film as described above, the microwave heating, as in the present embodiment, is favorable.

The reason is that, according to the present embodiment, the photoresist film is heated from the interior thereof, so the surface of the film is not hardened and the solvent is easy to volatilize away.

EFFECTS OF THE INVENTION (1) According to the present invention, a plate-like member is heat-treated by heating with an electromagnetic wave such as a microwave. The heating with the electromagnetic wave such as microwave generates heat by electromagnetic losses, such as resistance loss and dielectric loss, which are developed within the member by irradiation with the electromagnetic wave, so that the heating efficiency is excellent owing to the heat generation within the member. In this manner, according to the present invention, only the member is directly heat-treated, and a holding mechanism for holding the member, etc., is not heated. The capacity of members can, therefore, be minimized, so that the power of a heating source can be minimized.

(2) The member is held in a floating state and lies out of contact with the holding mechanism. Therefore, the uniform heating of the member can be maintained, and heating at high precision becomes possible. Since the member is in the floating state, it cannot be kept stationary, but the uniform heat treatment is possible owing to the microwave heating.

(3) Since heat is difficult to come away from the member, surplus heating becomes unnecessary and the power of the heating source need not be made great.

(4) Since the dissipation of heat from the member can be lessened, the member can be efficiently heated in a short time.

(5) Since the surroundings of the member are an atmosphere of low temperature, any unnecessary product does not deposit on the inner wall of a processing chamber.

(6) Since the member is heated by a microwave beam in Embodiment 2, the local heating becomes possible because only the desired part of the object to be heat-treated can be irradiated with the microwave beam.

(7) Since the semiconductor wafers are heat-treated one by one in Embodiments 1, 2 and 3, the apparatuses can be simplified in structure and reduced in size, and also automatic processing and continuous processing can be realized. Besides, the wafers can be processed irrespective of the magnitudes of the diameters thereof.

(8) According to the baking treatments of Embodiment 3, the baking time of each of the prebaking and the post-baking is 2 minutes. As compared with the prior art, heat-treatment employing a heat (baking time: 10 min.), the embodiment can treat the wafers in a shorter time and can enhance the throughput.

In the above, the invention has been specifically described in conjunction with certain embodiments. Needless to say, however, the present invention is not restricted to the foregoing embodiments, but it can be variously modified within a scope not departing from the subject matter thereof. For example, the microwave is projected while a magnetic field is applied to a reaction substance simultaneously with the heating of the object to be heat-treated, whereby the activation of a reaction phenomenon can also be achieved. In this case, enhancement in the reaction efficiency adds to the effects of permitting a reaction of good quality and a shortened processing time.

The present invention can perform the foregoing treatments in a high pressure atmosphere, a normal pressure atmosphere, a low pressure atmosphere, in vacuum, and in a substance adapted to transmit the microwave. In all the cases, effects similar to those of the embodiments can be attained.

FIELD OF UTILIZATION

In the foregoing, the invention has been principally described as to the cases of application to the formation of a protective film on a semiconductor wafer surface, the annealing treatment and the photoresist baking treatment in the manufacture of a semiconductor device which is the background field of utilization. However, the present invention is not restricted thereto, but it is also applicable to; e.g., vapor growth, impurity diffusion, crystal annealing and dry etching.

Besides, the present invention is applicable to the sintering of a circuit board made of ceramics.

Further, the present invention is applicable to the heat treatment of a plate-like member such as an amorphous alloy or a compound semiconductor.

What is claimed is:

1. A heat-treating method which comprises passing streams of inert gas over surface portions of a plate-like member within a chamber to cause the member to float while being moved vertically and being rotated in the gas; irradiating the floating member with microwaves to inductively heat the member to a constant temperature; admixing reaction gases with said inert gas and forming a film of a reaction product of the reaction gases on said surface portions of said plate-like member; said chamber including a member floating jig, a stream of said inert gas being passed into said jig to cause the member to float; said jig being made of a material which is transparent to the microwaves and which transmits the microwaves whereby the jig is not inductively heated to said constant temperature; the microwaves being projected through said jig onto said member; and the reaction product being selectively formed on said member without being formed on said member-floating jig.

2. A heat-treating apparatus comprising a processing chamber which heat-treats a plate-like member, a holding means which floats the member with a gas and holds the member in a non-contacting state while the member is being moved vertically and being rotated, means for supplying said gas to said chamber, said gas containing reaction gases that form a reaction product at predetermined temperatures and said means for supplying said gas to said chamber including a first means for supplying an inert gas and a second means for supplying reaction gases to said chamber with the inert gas, a microwave generator that projects microwaves onto said member to heat said member to said predetermined temperatures and a discharge means for discharging gas from said chamber; the processing chamber and the holding means being made of material that is not inductively heated by said microwaves whereby the reaction product is selectively formed on said member and not on the walls of the chamber and on said holding means.

* * * * *